United States Patent
Bayer et al.

(10) Patent No.: US 9,722,380 B1
(45) Date of Patent: Aug. 1, 2017

(54) NETWORK DISTRIBUTION ADAPTER FOR A MOTOR CONTROL CENTER

(71) Applicant: Rockwell Automation Technologies, Inc., Mayfield, OH (US)

(72) Inventors: Michael R. Bayer, Franklin, WI (US); Troy M. Bellows, Racine, WI (US); Calvin C. Steinweg, Hartford, WI (US); Todd R. Sauve, Oak Creek, WI (US); Emily M. Schimek, Milwaukee, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 15/216,778

(22) Filed: Jul. 22, 2016

(51) Int. Cl.
*H01R 33/76* (2006.01)
*H01R 33/88* (2006.01)

(52) U.S. Cl.
CPC ......... *H01R 33/7671* (2013.01); *H01R 33/88* (2013.01)

(58) Field of Classification Search
CPC .............................. H01R 33/88; H01R 33/7671
See application file for complete search history.

(56) References Cited

U.S. PATENT DOCUMENTS

| | | | | |
|---|---|---|---|---|
| 4,799,901 A * | 1/1989 | Pirc | ................... | H01R 13/6666 333/185 |
| 4,817,283 A * | 4/1989 | Johnston | ................ | H01R 43/16 29/883 |
| 5,044,981 A * | 9/1991 | Suffi | ...................... | H01R 31/06 439/533 |
| 5,269,708 A * | 12/1993 | DeYoung | ............ | H05K 1/0228 439/676 |
| 5,295,869 A * | 3/1994 | Siemon | ................ | G02B 6/3897 361/301.1 |
| 5,370,541 A * | 12/1994 | Bossard | .................... | H01R 9/24 439/131 |
| 5,447,441 A * | 9/1995 | Mueller | ................... | H02G 3/16 439/607.01 |
| 5,735,714 A * | 4/1998 | Orlando | ............ | H01R 13/6658 439/535 |
| 6,126,476 A * | 10/2000 | Viklund | ............. | H01R 13/6477 439/404 |
| 6,142,834 A * | 11/2000 | Liao | ....................... | H01R 24/62 379/438 |
| 6,146,207 A * | 11/2000 | Mulot | .................... | H01R 13/64 439/344 |
| 6,361,354 B1 * | 3/2002 | Viklund | ............. | H01R 13/6474 439/418 |
| 6,383,028 B1 * | 5/2002 | Chang | .................... | H01R 31/06 439/638 |
| 6,504,726 B1 * | 1/2003 | Grabinger | ............ | H05K 1/0228 361/796 |
| 6,626,694 B2 * | 9/2003 | Zielke | ................... | H01R 4/2429 439/404 |
| 6,736,670 B2 * | 5/2004 | Clark | ................... | H01R 13/518 439/540.1 |
| 6,761,585 B2 * | 7/2004 | Clark | ................... | H01R 13/518 439/540.1 |
| 7,066,771 B2 * | 6/2006 | Clark | ................... | H01R 13/518 439/676 |

(Continued)

*Primary Examiner* — Ross Gushi
(74) *Attorney, Agent, or Firm* — Boyle Fredrickson, S.C.

(57) ABSTRACT

A network distribution adapter may be configured to vertically connect a network cable on one side of an isolation wall (within a vertical wire-way) while connecting another network cable at an angle on an opposing side of the isolation wall (interior to the MCC). This may advantageously allow fitting the adapter in the limited space provided by the vertical wire-way while also providing more reliable protection for the network connections. In one aspect, the network distribution adapter may include a printed circuit board (PCB) which couples a first connector disposed in a first plane parallel to the PCB with a second connector disposed in a second plane at an angle to the first plane. The PCB may be mounted in a housing which, in turn, may be mounted in relation to an opening in the isolation wall.

19 Claims, 5 Drawing Sheets

(56) References Cited

U.S. PATENT DOCUMENTS

| | | | | |
|---|---|---|---|---|
| 7,241,182 B2* | 7/2007 | Clark | ............. | H01R 13/518 |
| | | | | 439/676 |
| 7,338,327 B2* | 3/2008 | Sticker | ............. | H01R 13/506 |
| | | | | 439/638 |
| 7,686,658 B2* | 3/2010 | Clark | ............. | H01R 13/518 |
| | | | | 439/676 |
| 7,762,839 B2* | 7/2010 | Chen | ............. | H01R 4/2416 |
| | | | | 439/540.1 |
| 7,905,753 B2* | 3/2011 | Siev | ............. | H01R 31/06 |
| | | | | 439/638 |
| 7,909,649 B2* | 3/2011 | Laroche | ............. | H01R 13/6625 |
| | | | | 439/620.21 |
| 7,976,334 B2* | 7/2011 | Bishop | ............. | H01R 4/2433 |
| | | | | 439/395 |
| 8,192,223 B2* | 6/2012 | Bishop | ............. | H01R 4/2433 |
| | | | | 439/395 |
| 8,410,520 B2* | 4/2013 | Penumatcha | ............. | H01R 13/5202 |
| | | | | 257/166 |
| 8,496,500 B1* | 7/2013 | Wu | ............. | H01R 13/6461 |
| | | | | 439/638 |
| 8,714,996 B2* | 5/2014 | Bishop | ............. | H01R 4/2433 |
| | | | | 439/397 |

* cited by examiner

NETWORK DISTRIBUTION ADAPTER FOR A MOTOR CONTROL CENTER

FIELD OF THE INVENTION

The present invention relates generally to electrical distribution systems, such as for the distribution of power signals to controlled equipment, and more particularly, to a network distribution adapter for electrical units which may be intelligently controlled in such systems.

BACKGROUND OF THE INVENTION

Electrical systems with packaged electrical and electronic components are known and are in use. For example, Motor Control Centers (MCC's) are used for power and data distribution in large and industrial operations. In MCC's, a variety of components, such as switchgear, semiconductor power electronic circuits, programmable logic controllers, motor controllers, and so forth, may be housed in large electrical enclosures which may be subdivided into sections or columns, which may be further subdivided into compartments or units. The MCC includes associated bus bars, interconnections and supporting structures for distribution of electrical power to the various compartments.

Some units in MCC's may be "intelligently" controlled by a network connection to another device, such as a Programmable Logic Controller (PLC). To connect such units to a device for intelligent control, it is necessary to run a network cable from the intelligent unit in the MCC to the device. Vertical and horizontal wire-ways, ordinarily used for running line and load wiring to service components of the MCC, may also be used for running such network cables. However, due to the limited space of such wire-ways, and the potentially delicate nature of traditional network connections in systems which typically require fault tolerance, running network cables in such wire-ways may be a challenge. A need therefore exists for a system in which network cables may be routed in an MCC in a fault tolerant, reliable manner.

SUMMARY OF THE INVENTION

The present inventors have determined that a network distribution adapter may be configured to vertically connect a network cable on one side of an isolation wall (within a vertical wire-way) while connecting another network cable at an angle on an opposing side of the isolation wall (interior to the MCC). This may advantageously allow fitting the adapter in the limited space provided by the vertical wire-way while also providing more reliable protection for the network connections. In one aspect, the network distribution adapter may include a printed circuit board (PCB) which couples a first connector disposed in a first plane parallel to the PCB with a second connector disposed in a second plane at an angle to the first plane. The PCB may be mounted in a housing which, in turn, may be mounted in relation to an opening in the isolation wall.

In one aspect, an Ethernet (or EtherNet/IP) adapter may be mounted in a vertical wire-way of each plug-in section within an MCC and each may be connected to a network access device with Ethernet cables being routed behind the vertical wire-way. This may allow for an Ethernet infrastructure to be pre-installed and organized, out of the way of end user cables which may also be routed through the vertical wire-ways. Each adapter may allow, for example, two Ethernet connections. Each section may accommodate, for example, up to four adapters which may provide up to eight connection points within each section. A device within the unit may be connected to the Ethernet adapters with short patch cables that can be easily managed and angled downward so that an end user is protected from breaking the adapter or Ethernet connection of a unit during commissioning activities. Accordingly, an adapter may provide routing for cables up or down behind the power wire-way within the same footprint, thereby providing protection for the cable connections to Ethernet enabled units, which may be replaced in the field.

Ethernet adapters could consist of a plastic housing and lid, for example, molded from a hardened resin, such as Valox 420SE0. The housing could include supports for a printed circuit board (PCB) and an emboss side which may snap fit together from two halves. The housing could be approximately 2¼ inches wide by 2¼ inches long by 1⅜" deep, and may be sloped at the top to include a recessed area to affix a 1.25 inches by 0.25 inch adapter port label. The adapter may be mounted in the front of the power wire-way to allow it to be field replaceable. The PCB may be designed with two straight RJ-45 connectors facing down on one side of the board and two angled RJ-45 connectors (45°) facing either up or down on the other side of the board. The top and bottom adapters may use the same plastic housing but different PCBs based on which angled connector is used.

Specifically then, one aspect of the invention may provide a network distribution adapter including: a housing; a printed circuit board (PCB) mounted in the housing, the PCB having top and bottom sides; a first network connector mounted to the top side of the PCB, the first network connector providing a top jack accessible through the housing, the top jack being disposed in a first plane parallel to the PCB; and a second network connector mounted to the bottom side of the PCB, the second network connector providing a bottom jack accessible through the housing, the bottom jack being disposed in a second plane at an angle to the first plane.

Another aspect of the invention may provide a Motor Control Center (MCC) including: an enclosure having a device mounting volume for supporting electrical units; a vertical wire-way disposed adjacently to the device mounting volume; a wall separating the vertical wire-way from an interior portion of the section; and a network distribution adapter including: a housing; a PCB mounted in the housing, the PCB having top and bottom sides; a first network connector mounted to the top side of the PCB, the first network connector providing a top jack accessible through the housing, the top jack being disposed in a first plane parallel to the PCB; and a second network connector mounted to the bottom side of the PCB, the second network connector providing a bottom jack accessible through the housing, the bottom jack being disposed in a second plane at an angle to the first plane. The network distribution adapter may be mounted to an opening in the wall so that the first network connector is accessible in the vertical wire-way and the second network connector is accessible in the interior portion of the section.

These and other features and advantages of the invention will become apparent to those skilled in the art from the following detailed description and the accompanying drawings. It should be understood, however, that the detailed description and specific examples, while indicating preferred embodiments of the present invention, are given by way of illustration and not of limitation. Many changes and modifications may be made within the scope of the present invention without departing from the spirit thereof, and the invention includes all such modifications.

DETAILED DESCRIPTION

Figure 1:
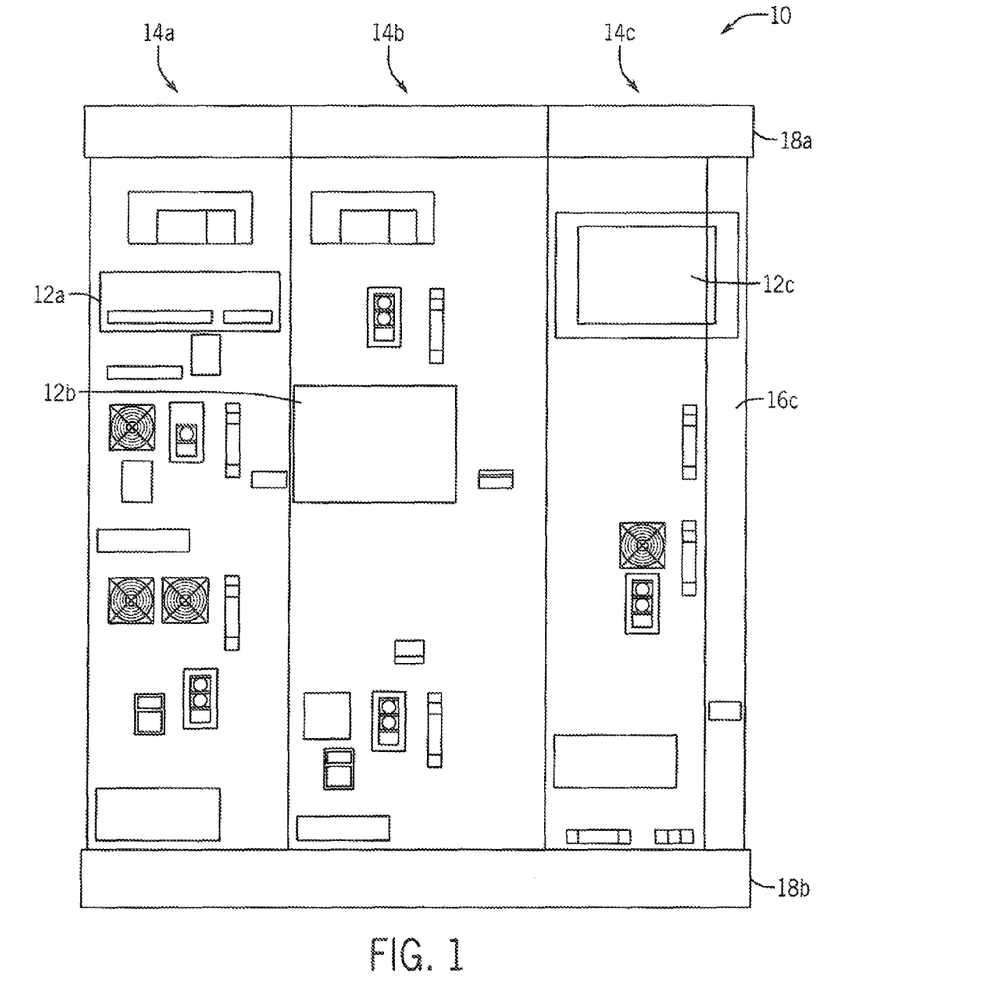
FIG. 1 is an exemplary electrical system in which electrical units of various types may be housed and one or more network distribution adapters may be installed in accordance with an aspect of the invention.

Referring now to FIG. 1, an exemplary electrical system 10 is provided in which electrical units 12 (such as units 12a, 12b and 12c as illustrated) of various types may be housed. The electrical system 10 may be, for example, a Motor Control Center ("MCC") or other industrial, commercial, marine, or other electrical system. One example of an electrical system 10 could be the Centerline 2100 Motor Control Center available from Rockwell Automation, Inc. In general, the electrical system 10 may provide one or more sections 14 (such as sections 14a, 14b and 14c as illustrated), each forming a shell around a device mounting volume for supporting the units 12. The shell may be made of any suitable material, such as heavy gage sheet metal, reinforced plastics, and so forth. The units 12 may typically be "plug-in" units which may be inserted and removed from a section 14, or "frame-mounted" units which may be built with a frame-mounted construction permanently mounted to a section 14 which cannot be easily inserted or removed.

The electrical system 10 may typically receive three-phase power from an external power supply, such as a power supply grid, and/or data signals, via appropriate conduits (not shown), and distribute the received power and/or data signals to one or more of the sections 14 in various manners. The sections 14 may be electrically isolated from one another, or alternatively, may be electrically joined with other sections 14, such as via common horizontal power buses (not shown).

The units 12 may each include a door for covering an assembly of components that are supported within each unit 12 via known methods, such as screwed or snap-in engagement, thereby providing mechanical and electrical connection to the electrical system 10. Exemplary components of the units 12 may include relays, motor starters, and Programmable Logic Controllers ("PLC's"), among others. Doors for the units 12 may include, for example, levers for operating disconnect switches, locks for preventing the doors from opening, and/or lights for indicating a safe condition for opening the doors. A latch rail (not shown) may be provided in each section 14 to interface with latches on the individual doors of the units 12.

The sections 14 may also include built-in wire-ways in which line and load wiring, cabling, and other connections may be made inside the electrical system 10. Vertical wire-ways 16 (such as vertical wire-way 16c, for the section 14c, as illustrated) may be disposed vertically in each section 14, adjacent to the device mounting volume for supporting the units 12. In addition, horizontal wire-ways 18 may be disposed horizontally in each section 14, such as upper horizontal wire-way 18a disposed horizontally above and adjacent to the upper most device mounting volume, and lower horizontal wire-ways 18b disposed horizontally below and adjacent to the lower most device mounting volume.

Figure 2:
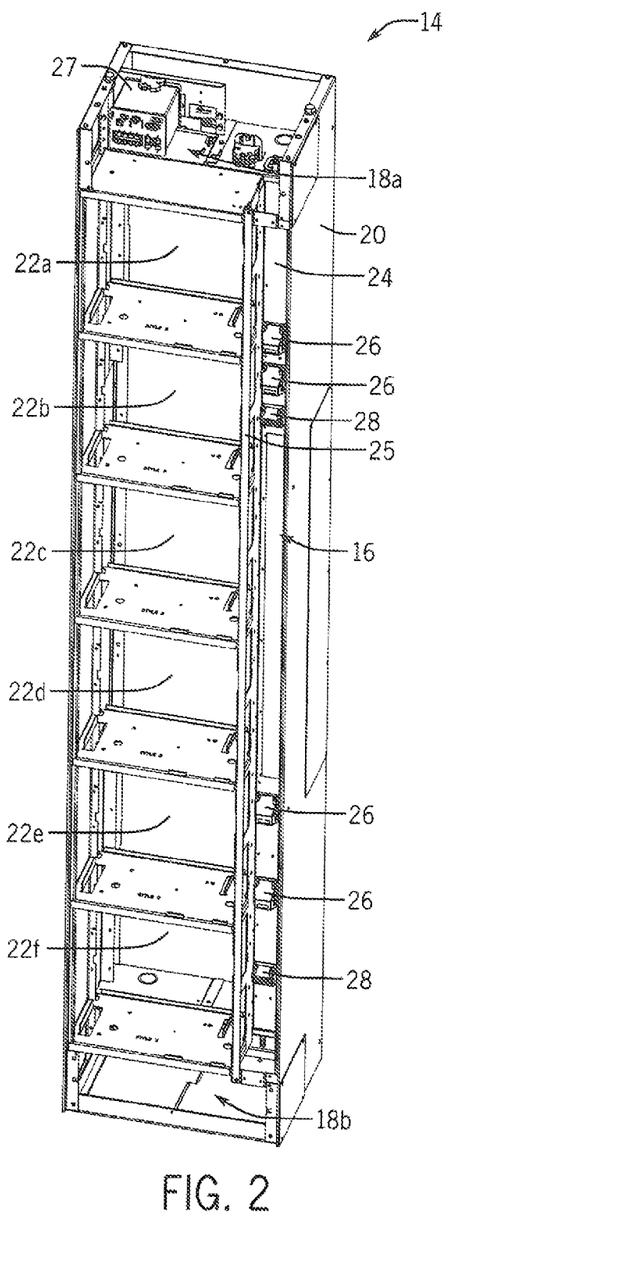
FIG. 2 is an isometric view of an exemplary section of the electrical system of FIG. 1.

Referring now to FIG. 2, an isometric view of an exemplary section 14 of the electrical system 10 is provided. The section 14 may be defined by an enclosure 20 forming a shell around the device mounting volumes 22 (such as device mounting volumes 22a through 22f as illustrated) for supporting the units 12. An isolation wall 24 may separate the vertical wire-way 16 from an interior portion of the section 14 and the electrical system 10 while still providing openings for network distribution adapters as will be further described. Also, a vertical wire-way wall 25 may separate the vertical wire-way 16 from the device mounting volumes 22 while still providing access areas 23 for network cables and/or other wiring to run between the vertical wire-way 16 and the device mounting volumes 22.

In one aspect, an "intelligent" unit 12a, which could be, for example, an EtherNet/IP controlled motor in the device mounting volume 22a, may be installed by an end user for control via a network connection with another device. Such a network connection could be made, for example, to another device in the electrical system 10, such as a network switch 27 provided in the upper horizontal wire-way 18a. One example of a network switch 27 could be a Stratix 5700 industrial managed Ethernet switch available from Rockwell Automation, Inc. Alternatively, such a network connection could be made to a PLC implemented in another intelligent unit in the electrical system 10, such as the intelligent unit 12c, or to another device external to the electrical system 10.

Figures 3, 4:
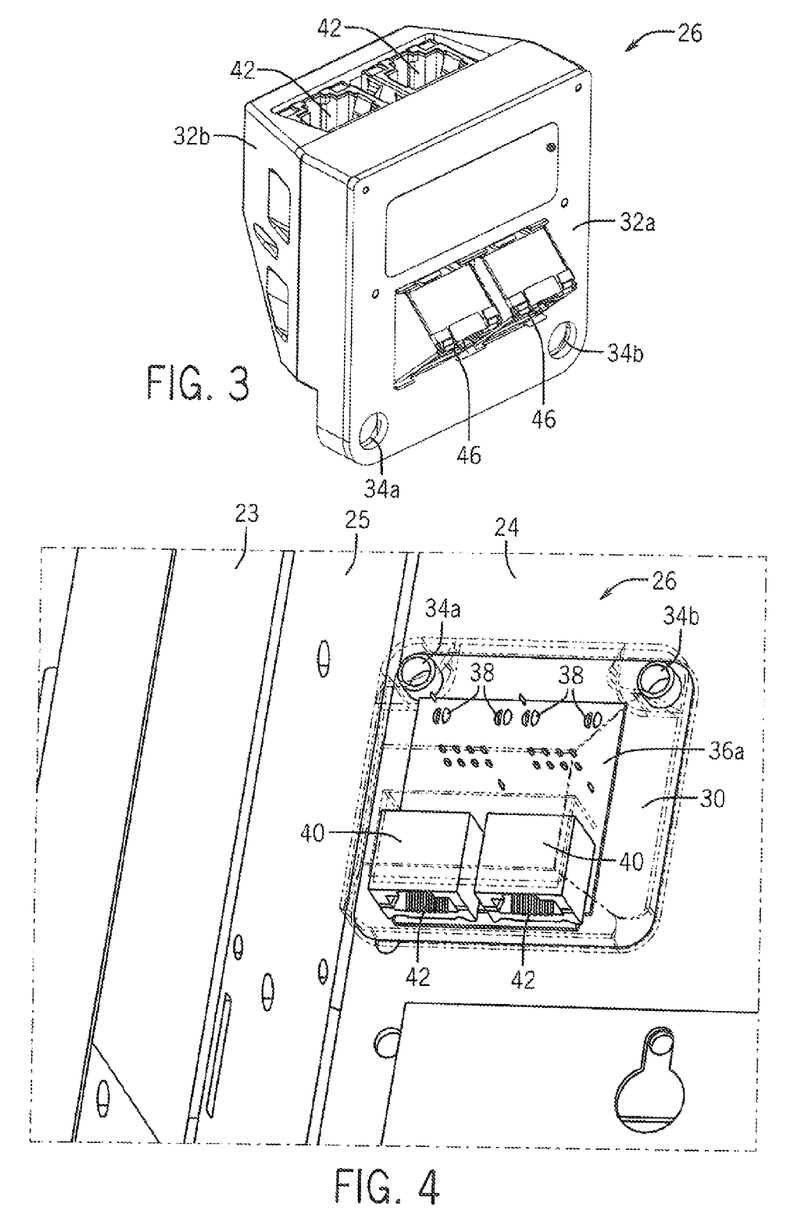
FIG. 3 is an isometric view of an exemplary network distribution adapter in accordance with an aspect of the invention.
FIG. 4 is an isometric cutaway view of a network distribution adapter installed in the section of FIG. 2.

With additional reference to FIG. 3, for reliably and efficiently routing such network cables and connections, the section 14 may include one or more network distribution adapters 26. The network distribution adapters 26 may be mounted to openings in the isolation wall 24 so that a network infrastructure may be pre-installed and organized, out of the way of end user cables, in the interior portion of the section 14, while an end user may simply complete the network using connections exposed in the vertical wire-way 16. Accordingly, a network distribution adapter 26 may vertically connect to a network cable on a side of the isolation wall 24 (within the vertical wire-way 16) that is exposed to the end user, which could then be connected to the intelligent unit 12a. In addition, the network distribution adapter 26 may be pre-installed with network cables on an opposing side of the isolation wall 24 (interior to the electrical system 10) to connect to another device in the electrical system 10, such as the network switch 27 or the intelligent unit 12c (implementing a PLC), or to simply be made available in the electrical system 10 for use elsewhere, such as in the horizontal wire-way 18. Power distribution adapters 28 may also be mounted to openings in the isolation wall 24, in the vertical wire-way 16, for similarly routing electrical power, such as 24V Direct Current (DC) power, which may be necessary for the intelligent device.

Referring now to FIG. 4, an isometric cutaway view of a network distribution adapter 26 installed in the section 14 is provided in accordance with an aspect of the invention. The network distribution adapter 26 may include a housing 30 surrounding the device. The housing 30 may include two housing halves (illustrated as first and second housing halves 32a and 32b, respectively, in FIG. 3) which may snap fit together. The housing 30 could be molded, for example, from a hardened resin, such as Valox 420SE0. The housing 30 may also include mounting apertures 34 (illustrated as first and second mounting apertures 34a and 34b, respectively, in FIG. 3) for mounting the housing 30 to the opening in the isolation wall 24. The housing 30 may be mounted, for example, by driving fasteners, such as self-threading screws, through the mounting apertures 34 and corresponding apertures in the isolation wall 24. Accordingly, the network distribution adapter 26 may be mounted in the front of the vertical wire-way 16 to allow it to be field replaceable. The housing 30 could be, for example, approximately 2¼ inches wide by 2¼ inches long by 1⅜ inches deep, and could be sloped at a housing top 31 to include a recessed area to affix a 1.25 inches by 0.25 inch adapter port label.

A printed circuit board (PCB) 36, having top and bottom sides 36a and 36b, respectively, may be mounted in the housing 30. The PCB 36 may be mounted to the housing, for example, using multiple snap features 38, which could be plastic fasteners having resilience for efficiently providing secure attachment. One or more first network connectors 40 (which may be straight Ethernet connectors) may be mounted to the top side 36a of the PCB 36. The first network connectors may each provide a top jack 42 accessible through the housing 30. The top jack 42 may be, for example, an RJ-45 jack for Ethernet connections. In a preferred aspect, two first network connectors 40 may be provided on the top side 36a of the PCB 36. Also, in a preferred aspect, the network distribution adapter 26 may be installed so that the first network connectors 40 (and the top jacks 42) are facing downward.

Figure 5:
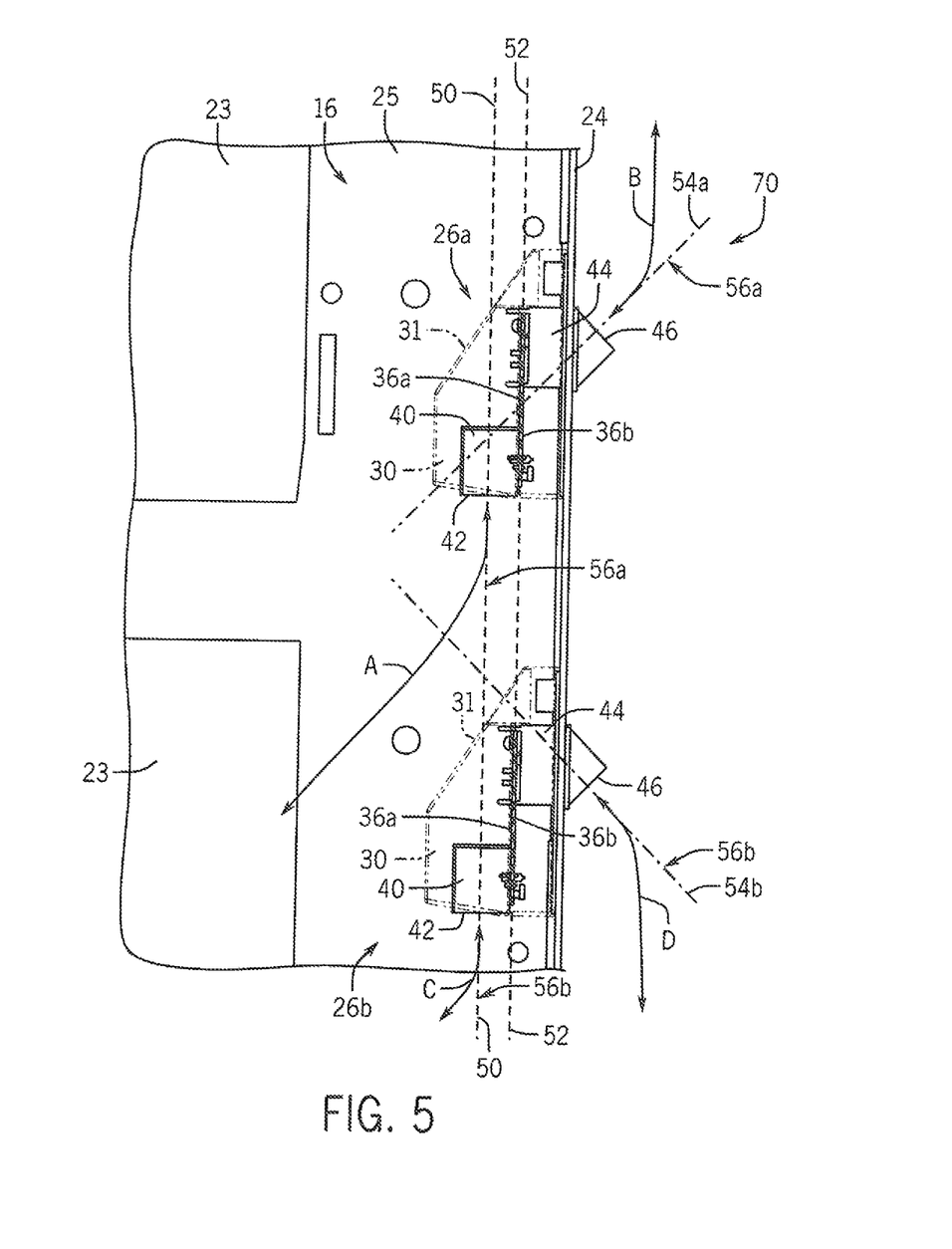
FIG. 5 is a cutaway side view of multiple network distribution adapters installed in the section of FIG. 2.

With additional reference to FIG. 5, illustrating first and second network distribution adapters 26a and 26b, respectively, installed in the section 14, one or more second network connectors 44 (which may be angled Ethernet connectors) may be mounted to the bottom side 36b of the PCB 36. The second network connectors 44 may each provide a bottom jack 46 accessible through the housing 30. The bottom jack 46 may also be, for example, an RJ-45 jack for Ethernet connections. In a preferred aspect, two second network connectors 44, each corresponding to a first network connector 40, may be provided on the bottom side 36b of the PCB 36. The first and second network connectors 40 and 44 may be electrically coupled via the PCB 36, which could comprise a simple copper trace pass through, or in other aspects, passive and/or active electrical components which may provide various signal functions. The second network connectors 44 (and the bottom jacks 46) may be configured on the network distribution adapter 26 so that they are substantially facing upward or downward as desired. The first and second connectors may be operable to display light from light emitting diodes (LED's), such as via integrated light pipes, as known in the art.

The top jack 42 may be disposed in a first plane 50 which may be parallel to the PCB 36 disposed in a PCB plane 52. In addition, the bottom jack 46 may be disposed in a second plane 54 (illustrated as second plane 54a with respect to the first network distribution adapter 26a, and second plane 54b with respect to the second network distribution adapter 26b, in FIG. 5) at an angle 56 (illustrated as angle 56a with respect to the first network distribution adapter 26a, and angle 56b with respect to the second network distribution adapter 26b, in FIG. 5) to the first plane 50.

Figure 6:
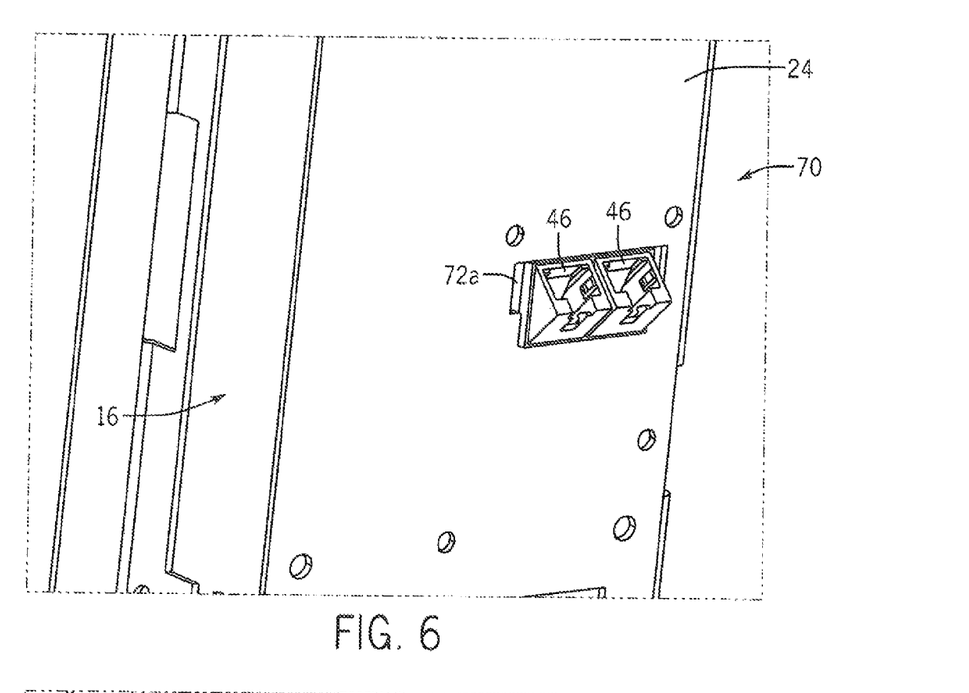
FIG. 6 is an isometric view of angled connectors of a network distribution adapter installed in the section of FIG. 2, appearing interior to the electrical system of FIG. 1.

In one aspect, the angle between the first and second planes 50 and 54 may be obtuse, such as the angle 56a between the first and second planes 50 and 54a, so that network cables "A" and "B" (each having first and second ends) may be routed in substantially opposing directions. In this configuration, the angle 56a may preferably be 135°. Accordingly, the bottom jack 46 may be accessible 135° away from the top jack 42, such as through a first opening 72a in the isolation wall 24. Referring briefly to FIG. 6, the bottom jack 46, as appearing in the interior portion 70 of the section 14, may be directed upward for accessibility, such as to the upper horizontal wire-way 18a.

Figure 7:
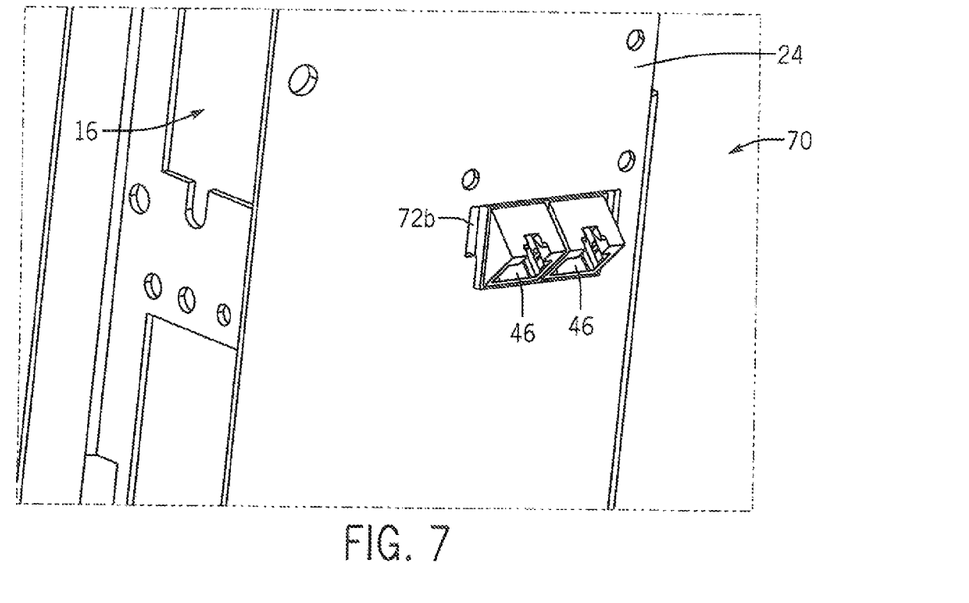
FIG. 7 is an isometric view of angled connectors of a network distribution adapter, according to an alternative aspect of the invention, installed in the section of FIG. 2, appearing interior to the electrical system of FIG. 1.

In another aspect, the angle between the first and second planes 50 and 54 may be acute, such as the angle 56b between the first and second planes 50 and 54b, so that network cables "C" and "D" (each having first and second ends) may be routed in substantially similar directions. In this configuration, the angle 56b may preferably be 45°. Accordingly, the bottom jack 46 may be accessible 45° away from the top jack 42, such as through a second opening 72b in the isolation wall 24. Referring briefly to FIG. 7, the bottom jack 46, as appearing in the interior portion 70 of the section 14, may be directed downward for accessibility, such as to the lower horizontal wire-way 18b.

As a result, the network distribution adapters 26 may be variously configured to advantageously fit in the limited space of the vertical wire-way 16 while providing reliable protection for such network connections. In one aspect, a section 14 may accommodate, for example, up to four network distribution adapters 26, which may provide up to eight connection points within the vertical wire-way 16.

Certain terminology is used herein for purposes of reference only, and thus is not intended to be limiting. For example, terms such as "upper," "lower," "above," and "below" refer to directions in the drawings to which reference is made. Terms such as "front," "back," "rear," "bottom," "side," "left" and "right" describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first," "second" and other such numerical terms referring to structures do not imply a sequence or order unless clearly indicated by the context.

When introducing elements or features of the present disclosure and the exemplary embodiments, the articles "a," "an," "the" and "said" are intended to mean that there are one or more of such elements or features. The terms "comprising," "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

Various features of the invention are set forth in the following claims. It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention: The embodiments described herein explain the best modes known for practicing the invention and will enable others skilled in the art to utilize the invention. All of the publications described herein including patents and non-patent publications are hereby incorporated herein by reference in their entireties.

The present invention may be part of a "safety system" used to protect human life and limb in a field, construction or other environment. Nevertheless, the term "safety," "safely" or "safe" as used herein is not a representation that the present invention will make the environment safe or that other systems will produce unsafe operation. Safety in such systems depends on a wide variety of factors outside of the scope of the present invention including: design of the safety system, installation and maintenance of the components of the safety system, and the cooperation and training of individuals using the safety system. Although the present invention is intended to be highly reliable, all physical systems are susceptible to failure and provision must be made for such failure.

What is claimed is:

1. A network distribution adapter comprising:
   a housing;
   a printed circuit board (PCB) mounted in the housing, the PCB having top and bottom sides;
   a first network connector mounted to the top side of the PCB, the first network connector providing a top jack accessible through the housing, the top jack being configured to receive a network cable in a first plane parallel to the PCB; and
   a second network connector mounted to the bottom side of the PCB, the second network connector providing a bottom jack accessible through the housing, the bottom jack being configured to receive a network cable in a second plane at an angle to the first plane,
   wherein the PCB is mounted to the housing via a plurality of snap features.

2. The network distribution adapter of claim 1, wherein the second plane is at a 45° angle to the first plane.

3. The network distribution adapter of claim 1, wherein the second plane is at a 135° angle to the first plane.

4. The network distribution adapter of claim 1, wherein the first and second network connectors are electrically coupled via the PCB.

5. The network distribution adapter of claim 1, wherein the first and second network connectors are RJ-45 connectors.

6. The network distribution adapter of claim 1, further comprising an aperture in the housing for mounting the housing to a wall.

7. The network distribution adapter of claim 1, further comprising:
   third and fourth network connectors,
   wherein the third network connector is mounted to the top side of the PCB adjacent to the first network connector, the third network connector providing a top jack accessible through the housing, the top jack being disposed in the first plane parallel to the PCB, and
   wherein the fourth network connector is mounted to the bottom side of the PCB adjacent to the second network connector, the fourth network connector providing a bottom jack accessible through the housing, the bottom jack being disposed in the second plane at the angle to the first plane.

8. A Motor Control Center (MCC) comprising:
   an enclosure having a device mounting volume for supporting electrical units;
   a vertical wire-way disposed adjacently to the device mounting volume;
   a wall separating the vertical wire-way from an interior portion of the MCC; and
   a network distribution adapter including:
      a housing;
      a PCB mounted in the housing, the PCB having top and bottom sides;
      a first network connector mounted to the top side of the PCB, the first network connector providing a top jack accessible through the housing, the top jack being configured to receive a network cable in a first plane parallel to the PCB; and
      a second network connector mounted to the bottom side of the PCB, the second network connector providing a bottom jack accessible through the housing, the bottom jack being configured to receive a network cable in a second plane at an angle to the first plane;
   wherein the network distribution adapter is mounted to an opening in the wall so that the first network connector is accessible in the vertical wire-way and the second network connector is accessible in the interior portion of the MCC.

9. The MCC of claim 8, further comprising an electrical cable having first and second ends and a horizontal wire-way disposed adjacently to the device mounting volume, wherein the first end of the electrical cable is connected to the second network connector and the second end of the electrical cable is provided in the horizontal wire-way.

10. The MCC of claim 9, further comprising a network switch in the horizontal wire-way, wherein the second end of the electrical cable is connected to the network switch.

11. The MCC of claim 9, further comprising a second electrical cable having first and second ends, wherein the first end of the second electrical cable is connected to the first network connector and the second end of the second electrical cable is provided in the device mounting volume.

12. The MCC of claim 8, wherein the bottom jack is disposed in the second plane at a 45° angle to the first plane so that the bottom jack is accessible 45° away from the top jack.

13. The MCC of claim 8, wherein the bottom jack is disposed in the second plane at a 135° angle to the first plane so that the bottom jack is accessible 135° away from the top jack.

14. The MCC of claim 8, further comprising a vertical wire-way wall separating the vertical wire-way from the device mounting volume, the vertical wire-way wall having an access area for running a network cable between the vertical wire-way and the device mounting volume.

15. The MCC of claim 8, wherein the network distribution adapter further includes apertures in the housing for mounting the housing.

16. The MCC of claim 15, further comprising fasteners received through the apertures, wherein the fasteners are operable to mount the housing to the wall.

17. The MCC of claim 8, wherein the network distribution adapter further includes:

third and fourth network connectors,
wherein the third network connector is mounted to the top side of the PCB adjacent to the first network connector, the third network connector providing a top jack accessible through the housing, the top jack being disposed in the first plane parallel to the PCB, and
wherein the fourth network connector is mounted to the bottom side of the PCB adjacent to the second network connector, the fourth network connector providing a bottom jack accessible through the housing, the bottom jack being disposed in the second plane at the angle to the first plane.

18. The MCC of claim 8, wherein the first and second network connectors are Ethernet connectors.

19. The MCC of claim 8, wherein the PCB is mounted to the housing via a plurality of snap features.

\* \* \* \* \*